United States Patent
Guerard et al.

(10) Patent No.: US 11,307,230 B2
(45) Date of Patent: Apr. 19, 2022

(54) SYSTEM AND METHOD FOR PROVIDING THE AMPLITUDE AND PHASE DELAY OF A SINUSOIDAL SIGNAL

(71) Applicant: OFFICE NATIONAL D'ETUDES ET DE RECHERCHES AÉROSPATIALES, Palaiseau (FR)

(72) Inventors: Jean Guerard, Juvisy-sur-Orge (FR); Béatrice Verlhac, Issy les Moulineaux (FR); Pierre Lavenus, Fontenay aux Roses (FR); Raphaël Levy, Paris (FR)

(73) Assignee: OFFICE NATIONAL D'ETUDES ET DE RECHERCHES AÉROSPATIALES, Palaiseau (FR)

( * ) Notice: Subject to any disclaimer, the term of this patent is extended or adjusted under 35 U.S.C. 154(b) by 476 days.

(21) Appl. No.: 16/308,659

(22) PCT Filed: Jun. 9, 2017

(86) PCT No.: PCT/FR2017/051464
§ 371 (c)(1),
(2) Date: Dec. 10, 2018

(87) PCT Pub. No.: WO2017/212187
PCT Pub. Date: Dec. 14, 2017

(65) Prior Publication Data
US 2019/0310294 A1    Oct. 10, 2019

(30) Foreign Application Priority Data
Jun. 10, 2016  (FR) ..................... 16 55330

(51) Int. Cl.
*G01R 25/00*  (2006.01)
*G01P 15/097*  (2006.01)
(Continued)

(52) U.S. Cl.
CPC ......... *G01R 25/00* (2013.01); *G01C 19/5776* (2013.01); *G01P 15/097* (2013.01);
(Continued)

(58) Field of Classification Search
CPC ...... G01R 25/00; G01R 19/04; G01R 19/175; G01C 19/5776; G01P 15/097; G06F 17/12
See application file for complete search history.

(56) References Cited

U.S. PATENT DOCUMENTS 5,166,959 A    11/1992  Chu et al.
2003/0174797 A1    9/2003  Grushin
(Continued)

FOREIGN PATENT DOCUMENTS

JP    2001-188011 A    7/2001
JP    2003-018007 A    1/2003
(Continued)

OTHER PUBLICATIONS

Liu et al., Digital Control and Performance Test of a Symmetrical Doubly Decoupled Micro-Machined Gyroscope, 2009 IEEE, pp. 85-88 (Year: 2009).*
(Continued)

*Primary Examiner* — Toan M Le
(74) *Attorney, Agent, or Firm* — Nixon & Vanderhye

(57) ABSTRACT

Disclosed is a system and method that provide an amplitude value and a phase delay value which relate to a sinusoidal signal to be measured. For this purpose, phase values of a reference signal, at which the signal to be measured exceeds or falls below the reference signal, are collected and transmitted to a computation unit. The computation unit determines the amplitude and delay values from the collected
(Continued)

phase values. The system can be implemented in a cost-effective manner, in particular using an ASIC circuit or an FPGA circuit.

20 Claims, 5 Drawing Sheets

(51) Int. Cl.
    *G01C 19/5776*     (2012.01)
    *G01R 19/04*     (2006.01)
    *G01R 19/175*     (2006.01)
    *G06F 17/12*     (2006.01)
    *G01P 15/18*     (2013.01)

(52) U.S. Cl.
    CPC ........... *G01R 19/04* (2013.01); *G01R 19/175* (2013.01); *G06F 17/12* (2013.01); *G01P 15/18* (2013.01)

(56) References Cited

U.S. PATENT DOCUMENTS

| | | | |
|---|---|---|---|
| 2004/0070529 | A1 | 4/2004 | Kamas et al. |
| 2004/0085096 | A1 | 5/2004 | Ward et al. |
| 2009/0320553 | A1 | 12/2009 | Weston et al. |
| 2012/0078556 | A1 | 3/2012 | Holmberg et al. |
| 2014/0132186 | A1* | 5/2014 | Tazartes ............. G01C 19/5776 318/128 |

FOREIGN PATENT DOCUMENTS

| | | |
|---|---|---|
| JP | 2009-536335 A | 10/2009 |
| JP | 2016-519762 A | 7/2016 |
| WO | WO 2008/022653 | 2/2008 |

OTHER PUBLICATIONS

IEEE Xplore Search Results, Apr. 22, 2021, 1 pp. (Year: 2021).*
IEEE Xplore Search Results, Apr. 23, 2021, 1 pp. (Year: 2021).*
Hi LL G: "The Benefits of Undersampling", Electronic Design, Penton Media, Cleveland, OH, US, vo 1. 42, No. 14, Jul. 11, 1994 (Jul. 11, 1994), XP000459838, ISSN: 0013-4872 ie document en entier.
K.R. Rao et al: "Discrete Fourier Transform"In: "Digital Video and Audio Broadcasting Technology: A Practical Engineering Guide (3rd edition)". Jan. 1, 2010 (Jan. 1, 2010). XP055354004, ISSN: 1860-4862 ISBN: 978-3-642-11611-7.
International Search Report, PCT/FR2017/051464, dated Dec. 6, 2017.
Edward Lee et al: "Sampling and Reconstruction", Structure and Interpretation of Signals and Systems, Jan. 1, 2003 (Jan. 1, 2003), pp. 373-392, XP055354015, ISBN: 978-0-201-74551-1 Extra it de 1 1 Internet: URL:https://chess.eecs.berkeley.edu/eecsl24/reading/LeeAndVaraiyall.pdf [extrait le Mar. 13, 2017].
Roberto Micheletti: "Phase Angle Measurement Between Two Sinusoidal Signals", IEEE Trans. Instr. Meas. vol. 40, No. 1, Feb. 1, 1991 (Feb. 1, 1991), pp. 40-42, XP055353815, Extra it de I l'nternet: URL:http://ieeexplore.ieee.org/elxl/19/2452/00069948.pdf?tp=&amumber=69948&isnumber=2452 [extrait le Mar. 10, 2017] ie document en entier.
Baptiste Marechal et al: "Direct digital synthesiser (DDS) design parameters optimisation for vibrating MEMS sensors: Optimisation of phase accumulator, Look-Up Table (LUT) and Digital to Analog Converter (DAC) sizes", 2014 Symposium On Design, Test, Integration and Packaging of MEMS/MOEMS (DTIP), Circuits Multi Projets—CMP, Apr. 1, 2014 (Apr. 1, 2014), pp. 1-5, XP032746454, D0I: 10.1109/DTIP.2014.7056692ISBN: 978-2-35500-028-7.
Office Action issued in Japanese Patent Application No. 2018-563911 dated Mar. 16, 2021.

* cited by examiner $$a \cdot \sin\left(\alpha_{k0} + \frac{Q}{P} \cdot \psi_k - \phi\right) = \sin(\psi_k)$$

FIG. 3a $$\begin{bmatrix} \vdots & \vdots \\ \sin\left(\alpha_{k0} + \frac{Q}{P} \cdot \psi_k\right) & -\cos\left(\alpha_{k0} + \frac{Q}{P} \cdot \psi_k\right) \\ \vdots & \vdots \end{bmatrix} \times \begin{bmatrix} X \\ Y \end{bmatrix} = \begin{bmatrix} \vdots \\ \sin(\psi_k) \\ \vdots \end{bmatrix}$$

FIG. 3b $$\begin{bmatrix} \vdots & \vdots \\ \sin \alpha_{k0} & -\cos \alpha_{k0} \\ \vdots & \vdots \end{bmatrix} \times \begin{bmatrix} X \\ Y \end{bmatrix} = \begin{bmatrix} \vdots \\ \psi_k \\ \vdots \end{bmatrix}$$

FIG. 3c $$\psi_k = H_{1p} \cdot \cos(\alpha_{k0}) + H_{1q} \cdot \sin(\alpha_{k0})$$
$$+ H_{2p} \cdot \cos(2 \cdot \alpha_{k0}) + H_{2q} \cdot \sin(2 \cdot \alpha_{k0})$$
$$+ H_{3p} \cdot \cos(3 \cdot \alpha_{k0}) + H_{3q} \cdot \sin(3 \cdot \alpha_{k0}) + \ldots$$

FIG. 4a

$$\begin{bmatrix} H'_{1p} \\ H'_{1q} \end{bmatrix} = \begin{bmatrix} +1 & +1 & +1 & +1 & +1 & +1 & -1 & -1 & -1 & -1 & -1 & -1 \\ +1 & +1 & +1 & -1 & -1 & -1 & -1 & -1 & -1 & +1 & +1 & +1 \end{bmatrix} \times \begin{bmatrix} \ldots & \psi_k & \ldots \end{bmatrix}$$

$$\begin{bmatrix} H'_{3p} \\ H'_{3q} \end{bmatrix} = \begin{bmatrix} +1 & +1 & -1 & -1 & +1 & +1 & -1 & -1 & +1 & +1 & -1 & -1 \\ +1 & -1 & -1 & +1 & +1 & -1 & -1 & +1 & +1 & -1 & -1 & +1 \end{bmatrix} \times \begin{bmatrix} \ldots & \psi_k & \ldots \end{bmatrix}$$

FIG. 4b

SYSTEM AND METHOD FOR PROVIDING THE AMPLITUDE AND PHASE DELAY OF A SINUSOIDAL SIGNAL

The present invention relates to a system and method for providing the amplitude and phase delay of a sinusoidal signal.

In the present description, the term phase delay of a sinusoidal signal refers to the opposite of the value of the phase of this signal for a time of origin, also called initial time and corresponding to t=0, where t denotes the time variable.

BACKGROUND OF THE INVENTION

Many applications require characterizing a sinusoidal signal by its amplitude and its phase delay. Such is the case in particular for characterizing the response of a resonator to an excitation signal, the resonator possibly being part of a vibrating accelerometer or a vibrating gyroscope.

One of the most common ways to do this is to digitize the sinusoidal signal and then analyze it, for example by Fourier transform. However, the digitization of a signal, which comprises sampling it at defined times and quantifying the values of the signal that are effective at those times, is carried out using analog-to-digital converters which are mixed electronic components, implemented in specific semiconductor technologies. For this reason, analog-to-digital converters require significant development in order to be qualified for space applications, which increases their cost.

To avoid these disadvantages of analog-to-digital converters, it is also known, in particular from U.S. Pat. No. 5,166,959, to characterize a sinusoidal signal by identifying the cancellation times of this signal. But such method does not allow determining the amplitude of the sinusoidal signal, but only its phase delay, and is not very accurate when the signal amplitude is low and/or has a low signal-to-noise ratio.

Patent WO 2008/022653 discloses a system for measuring a sine wave, which is based on dates of comparison of a signal to be identified with a reference signal.

On another hand, the article from R. Micheletti which is entitled «Phase Angle Measurement Between Two Sinusoïdal Signals», IEEE Trans. Instr. Meas. Vol. 40, No. 1, 1 Feb. 1991, pp. 40-42, XP055353815, proposes an algorithm for measuring the phase angle between two signals. The algorithm is based on a least-square method and is implemented from digital signals.

Finally, the article from B. Marechal et al., which is entitled «Direct Digital Synthetizer (DDS) design parameters optimisation for vibrating MEMS sensors», 2014 SYMPOSIUM ON DESIGN, TEST, INTEGRATION AND PACKAGING OF MEMS/MOEMS (DTIP), CIRCUITS MULTI PROJETS—CMP—1 Apr. 2014, pp. 1-5, XP032746454, proposes optimized designs for digital signal synthetizing units.

SUMMARY OF THE INVENTION

Based on this situation, an object of the invention consists in determining the amplitude and phase delay of a sinusoidal signal in a novel way, with no need for an analog-to-digital converter.

A related object of the invention consists of providing a system able to determine the amplitude and phase delay of a sinusoidal signal, which is inexpensive and which can be qualified for space applications at reduced cost.

Another object of the invention consists in providing such system having a significant part which can be shared among multiple channels which are each dedicated to determining the amplitude and phase delay of a sinusoidal signal different than that of the other channels, all channels operating continuously and simultaneously.

Finally, yet another object of the invention consists in providing such system that is accurate even for a sinusoidal signal of low amplitude, possibly superimposed on noise.

To achieve at least one of these or other objects, a first aspect of the invention proposes a system for providing an amplitude value and a phase delay value which relate to a signal to be measured having sinusoidal variations over time with a frequency F, this system comprising:

- a synthesis unit, adapted to generate a reference signal having a sinusoidal form of time-variations, in continual phase coherence with the signal to be measured, this reference signal having an amplitude larger than that of the signal to be measured and having a frequency equal to $F_{ref}=F\times P/Q$, where P and Q are two fixed, non-zero positive integers, P being greater than Q;
- a comparator which is connected to receive the signal to be measured and the reference signal on two of its inputs, and which is adapted to output a signal transition each time the signal to be measured becomes less than the reference signal, or each time the signal to be measured becomes greater than the reference signal;
- a latch register, which is connected to receive instantaneous values of a phase of the reference signal on its data input, and to receive a signal that is outputted by the comparator on its enabling input, and which is adapted to select those phase values of the reference signal that are received by the register at a same time as a transition of the signal produced by the comparator, the comparator and the register thus forming an acquisition channel for the signal to be measured; and
- a computation unit which is connected to receive the selected values for the phase of the reference signal, and which is adapted to calculate the values of the amplitude and phase delay of the signal to be measured from these selected values for the phase of the reference signal.

Thus, the system of the invention proceeds by identifying the phase values of the reference signal for which the signal to be measured becomes smaller than the reference signal or larger than that signal. From these phase values, the computation unit determines the amplitude and phase delay of the signal to be measured.

The system of the invention thus uses no analog-to-digital converter for determining the amplitude and phase delay of the sinusoidal signal to be measured.

The latch register and the synthesis unit for generating the reference signal are simple digital components that are inexpensive and can be qualified for space applications without significant development, once basic digital functions are qualified in a given technology. As for the comparator, it performs a mixed function but does so without difficulty, as it can be as simple as a differential pair of transistors.

The same is true for the computation unit, which may comprise or be implemented as a dedicated circuit or an application-specific integrated circuit, designated by the acronym ASIC, or as a programmable circuit, designated by the acronym FPGA, for which the feasible levels of integration have increased sharply in recent years while their costs have greatly decreased. Indeed, the amplitude and phase delay of the signal to be measured can be calculated mainly by operations of addition, multiplication, and subtraction of numbers, partly with numerical values that are fixed and which can therefore be stored beforehand. In a known manner, the design and description of the computation unit in the form of an ASIC or an FPGA can be done in a very flexible and cost-effective manner in languages such as VHDL or Verilog. In general, for the invention, at least one among the synthesis unit, the latch register, and the computation unit may advantageously be formed by such a dedicated circuit (ASIC) or by such a programmable logic circuit (FPGA).

Finally, since the times which are identified concern comparing the signal to be measured with a variable reference signal, these times can be identified with good accuracy even if the signal to be measured has low amplitude and has noise interference.

In preferred embodiments of the invention, the integer P may be equal to the integer Q plus one: P=Q+1.

Again in general for the invention, the computation unit may be adapted to calculate an in-phase amplitude value of the signal to be measured, equal to $a \cdot \cos \Phi$ where $\Phi$ is the value of the phase delay of the signal to be measured and a is a quotient of the amplitude of the signal to be measured divided by the amplitude of the reference signal, and a quadrature amplitude value of the same signal to be measured, equal to $a \cdot \sin \Phi$. These values can be calculated from a system of affine equations having coefficients, for the in-phase amplitude and quadrature amplitude of the signal to be measured, which depend on the selected values for the phase of the reference signal.

According to a first design possible for the computation unit, it can perform an exact resolution of the system of affine equations having as unknown quantities the in-phase amplitude values $a \cdot \cos \Phi$ and the quadrature values $a \cdot \sin \Phi$ of the signal to be measured. In such case, the computation unit may be adapted to calculate the coefficients of the system of affine equations from the selected values for the phase of the reference signal, and to calculate the values of the in-phase amplitude and quadrature amplitude of the signal to be measured by applying an algorithm for solving this system of affine equations. In particular, an affine equation inversion algorithm or a least-square resolution algorithm may be implemented by the computation unit in order to solve the system of affine equations having the in-phase and quadrature amplitude values of the signal to be measured as unknown quantities.

According to a second design possible for the computation unit, this unit can achieve a first-order resolution, as a function of the amplitude of the signal to be measured, of the system of affine equations having the in-phase amplitude value $a \cdot \cos \Phi$ and quadrature amplitude value $a \cdot \sin \Phi$ of the signal to be measured as unknown quantities. Such method is suitable when the amplitude of the signal to be measured is smaller than that of the reference signal. In this case, the computation unit can be adapted to determine approximate values for the coefficients of the in-phase amplitude and quadrature amplitude in the system of affine equations, these approximate values of the coefficients being independent of the selected values for the phase of the reference signal, and the selected values for the phase of the reference signal constituting affine terms of the system of affine equations. Then, the computation unit may further be adapted to calculate approximate values of the in-phase amplitude and quadrature amplitude of the signal to be measured, as simple linear combinations of the selected values for the phase of the reference signal.

According to a third design possible for the computation unit, this unit can achieve a resolution of the system of affine equations by decomposing the phase values of the reference signal which are selected by the latch register, into fundamental and harmonic components. Specifically, the computation unit may be adapted to calculate amplitudes of fundamental in-phase and quadrature components and of harmonic components, for the selected values for the phase of the reference signal. Then, the computation unit may further be adapted to calculate approximate values of the in-phase amplitude $a \cdot \cos \Phi$ and quadrature amplitude $a \cdot \sin \Phi$ of the signal to be measured, from linear combinations of the amplitudes of the fundamental in-phase and quadrature components and the harmonic components of the selected values for the phase of the reference signal.

Preferably, when the third design of the computation unit is used, the computation unit may be adapted to calculate approximate values for the amplitudes of the fundamental in-phase and quadrature components and the harmonic components of the selected values for the phase of the reference signal, as combinations of additions and subtractions of the selected values for the phase of the reference signal. It can then further be adapted to calculate the approximate values for the in-phase amplitude $a \cdot \cos \Phi$ and quadrature amplitude $a \cdot \sin \Phi$ of the signal to be measured, from linear combinations of the approximate values for the amplitudes of the fundamental in-phase and quadrature components and the harmonic components of the selected values for the phase of the reference signal. In such case, the integer P is advantageously a multiple of 60.

When multiple sinusoidal signals have to be characterized simultaneously and continuously, one acquisition channel may be separately dedicated to each of these signals, but the synthesis unit may be shared between all the acquisition channels in order to supply each of them with the reference signal and the instantaneous values of its phase. Thus, such system which is adapted to provide amplitude and phase delay values relating to a plurality of signals to be measured, each having sinusoidal variations over time, all with the frequency F, may comprise acquisition channels which are respectively and individually dedicated to the signals to be measured, each acquisition channel comprising a comparator and a latch register adapted and connected as described above, separately from the other acquisition channels. The synthesis unit may then be common to all the acquisition channels, for transmitting the reference signal simultaneously to all the comparators and for transmitting the instantaneous values of the phase of the reference signal simultaneously to all the latch registers. Possibly, the computation unit may also be common to all the acquisition channels, for determining an amplitude value and a delay value separately for each signal to be measured, to which one of the acquisition channels is dedicated.

In particular embodiments of the invention, the system may comprise:
  an input for receiving a clock signal;
  a first cyclic accumulator, which is adapted to generate a phase of an excitation signal from the clock signal in accordance with a first accumulation increment;
  a second cyclic accumulator, which is adapted to generate a phase of the reference signal from the clock signal in accordance with a second accumulation increment;
  a first signal-shaping unit, for producing the excitation signal with a sinusoidal form of time-variations, from the phase generated by the first cyclic accumulator; and a second signal-shaping unit, for producing the reference signal from the phase generated by the second cyclic accumulator.

The system may then be adapted to provide the excitation signal to an external device, and to collect the signal to be measured as a response of this external device to the excitation signal. To do so, the first and second accumulation increments are positive integers, such that a quotient of the first accumulation increment divided by Q is equal to a quotient of the second accumulation increment divided by P, and is also equal to a positive integer called cycle increment. In this manner, the frequency F may be equal to a first product of a frequency of the clock signal multiplied by the integer Q and by the cycle increment, divided by $2^{NA}$ where NA is the number of bits used in each cyclic accumulator, and the reference frequency $F_{ref}$ may be equal to a second product of the frequency of the clock signal multiplied by the integer P and by the cycle increment, divided by $2^{NA}$.

The output from the second cyclic accumulator is then connected to the input of the latch register of each acquisition channel in order to transmit the instantaneous values of the phase of the reference signal, and the output of the second signal-shaping unit is simultaneously connected to the input of the comparator of each acquisition channel in order to transmit the reference signal itself.

A second aspect of the invention proposes a method for providing an amplitude value and a phase delay value which relate to a signal to be measured having sinusoidal variations over time with a frequency F. The method comprises the following steps:
  generating a reference signal having a sinusoidal form of time-variations, in continual phase coherence with the signal to be measured, the reference signal having an amplitude larger than the amplitude of the signal to be measured, and having a frequency equal to $F_{ref}=F\times P/Q$, where P and Q are two fixed, non-zero positive integers P being greater than Q;
  selecting instantaneous values of a phase of the reference signal, for which the signal to be measured becomes smaller than the reference signal, or for which the signal to be measured becomes larger than the reference signal; and
  calculating the values of the amplitude and the phase delay of the signal to be measured, from the selected values for the phase of the reference signal.

Such a method can be carried out using a system that is according to the first aspect of the invention.

Advantageously, a method according to the invention may be used for characterizing a response of a resonator vibrated by an excitation signal having a sinusoidal form of time-variations with frequency F. The signal to be measured is then formed by the response of the resonator to the excitation signal. In particular, the resonator may be part of a vibrating accelerometer or a vibrating gyroscope, and the values of the amplitude and phase delay relating to the signal to be measured are then used to calculate acceleration or rotational speed values of a device or a vehicle carrying the accelerometer or gyroscope.

BRIEF DESCRIPTION OF THE DRAWINGS

Other features and advantages of the invention will become apparent from the following description of some non-limiting exemplary embodiments, with reference to the accompanying drawings, in which:

FIGS. 3a to 3c reproduce three forms of a system of affine equations having in-phase amplitude and quadrature amplitude of a signal to be measured as unknown quantities;

FIG. 4a reproduces a Fourier series decomposition of phase values used in the invention;

FIG. 4b illustrates a way to calculate approximate values for Fourier coefficients of phase values used in the invention.

In FIGS. 1 and 5, the double-line arrows indicate transmission of binary words, and the single-line arrows indicate analog signal transmissions.

DETAILED DESCRIPTION OF THE PREFERRED EMBODIMENTS

A system according to the invention is intended to characterize a sinusoidal signal, called the signal to be measured and denoted s(t), for which the time-variation frequency is assumed to be known. This signal to be measured is therefore of the form:

$$s(t)=A\cdot\sin(2\pi\cdot F\cdot t-\Phi) \quad (1)$$

where t denotes time, F is the known frequency of the signal s(t), and A and $\Phi$ are respectively the amplitude and the phase delay of the signal s(t). The object of the invention is therefore to determine the values of the amplitude A and the phase delay $\Phi$.

To do so, the invention makes use of another sinusoidal signal, called the reference signal and denoted r(t), which is fully known and is generated so as to be in continual phase coherence with the signal to be measured s(t). Continual phase coherence between the signals s(t) and r(t) is understood to mean a property of these signals which consists of each evolving according to its respective frequency, starting from a phase difference which initially exists between the two signals. In other words, each signal has a frequency stability such that it retains, at least over the time required to characterize the signal to be measured s(t), a fixed value for its own phase delay. By appropriately selecting the initial time defined as t=0, the reference signal can be written in the form:

$$r(t)=-A_{ref}\sin(2\pi\cdot F_{ref}t) \quad (2)$$

In other words, the initial time t=0 is defined such that the reference signal r(t) has a phase delay equal to $\pi$. $A_{ref}$ and $F_{ref}$ are respectively the amplitude and the time-variation frequency of the reference signal r(t), assumed to be known. In the following, the phase of the reference signal r(t) is denoted $\psi(t)$: $\psi(t)=2\pi\cdot F_{ref}t$.

Figure 1:
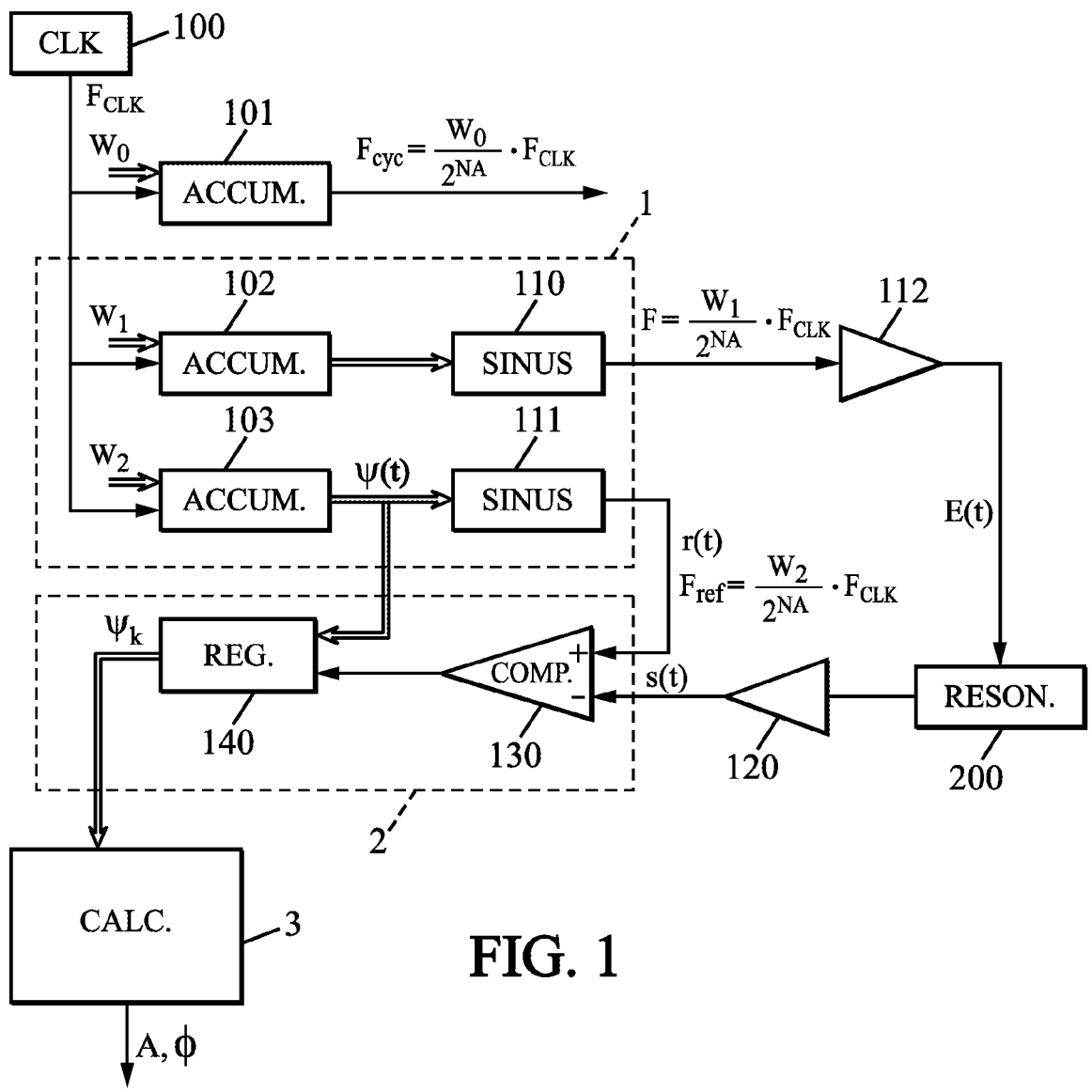
FIG. 1 is a block diagram of a system according to the invention.

In FIG. 1, the reference signal r(t) is generated by the synthesis unit 1. According to one possible embodiment of the synthesis unit 1 which is particularly suitable for the invention, this unit may comprise a cyclic accumulator 103, called second cyclic accumulator in the general part of this description and denoted ACCUM., which receives as input a periodic signal supplied by a clock 100, denoted CLK. The clock 100 may be external to the synthesis unit 1, and in particular may be shared with other electronic modules or systems external to the system of the invention. The cyclic accumulator 103 therefore outputs a linear ramp which is reset automatically, at frequency $F_{ref}=F_{CLK}\cdot W_2/2^{NA}$, where $F_{CLK}$ is the frequency of the clock 100, $W_2$ is a fixed accumulation increment, and NA is the number of bits used for the cyclic accumulator. A signal-shaping unit 111, denoted SINUS, transforms the ramp produced by the cyclic accumulator 103 into a sinusoidal signal, still at frequency $F_{ref}$. In a known manner, the signal-shaping unit 111 may be implemented in the form of a digital lookup table which is combined with a digital-to-analog converter, or in the form of a filtering transformer, etc. The signal produced by the unit 111 is the reference signal r(t), and the signal which is generated by the cyclic accumulator 103 is the phase of this reference signal r(t), denoted by $\psi p(t)$ where t is the time again.

Actually, for many applications of the invention, the signal to be measured s(t) is a response of a resonator, referenced 200, denoted RESON, and also commonly referred to as a forced oscillator, to an excitation signal. This excitation signal, denoted E(t), therefore has the same frequency F as the signal to be measured s(t). The excitation signal E(t) and signal to be measured s(t) are therefore naturally in continual phase coherence with one another, and it is then necessary to ensure that the excitation signal E(t) and the reference signal r(t) are themselves in continual phase coherence with one another. A preferred way to ensure such continual phase coherence between the excitation signal E(t) and the reference signal r(t) consists in generating the latter also by using the synthesis unit 1. To do this, the synthesis unit 1 may also comprise another cyclic accumulator 102, called first cyclic accumulator in the general part of this description, which also receives as input the periodic signal supplied by the clock 100. The cyclic accumulator 102 outputs another linear ramp which is reset automatically, to frequency $F=F_{CLK} \cdot W_1/2^{NA}$, where $W_1$ is another fixed accumulation increment. $W_1$ and $W_2$ were respectively called the first and second accumulation increments in the general part of the present description.

The signal-shaping unit 110 transforms the ramp produced by the cyclic accumulator 102 into another sinusoidal signal, which has the frequency F. This signal-shaping unit 110 may also be implemented in the form of a digital lookup table which is combined with a digital-to-analog converter, or in the form of a filtering transformer, etc. The signal produced by the unit 110, and then possibly amplified by an amplifier 112, is the excitation signal E(t).

The accumulation increments $W_1$ and $W_2$ are positive integers, further selected such that $W_1/Q=W_2/P=W_0$, where P and Q are two fixed, non-zero positive integers, with P greater than Q. Thus: $F_{ref}=F_{CLK} \cdot (P \cdot W_0)/2^{NA}$, $F=F_{CLK} \cdot (Q \cdot W_0)/2^{NA}$, and therefore $F_{ref}=F \cdot P/Q$. The frequency $F_{ref}$ of the reference signal r(t) is therefore higher than the frequency F of the signal to be measured s(t). For example, the clock frequency $F_{CLK}$ may be equal to 300 MHz, and the number NA of bits used in the cyclic accumulators 102 and 103 may be 32. In such case, the ratio of $F_{ref}$ to $F_{CLK}$ can be about 1/1000 for example.

In addition, the integers P and Q may advantageously be selected such that $W_0$ is also a positive integer, called cycle increment. In this case, the synthesis unit 1 may further comprise another cyclic accumulator, referenced 101 in FIG. 1, which also receives the clock signal at frequency $F_{CLK}$, and which has the cycle increment $W_0$ as the accumulation increment. Cyclic accumulator 101 therefore outputs a linear ramp which is reset periodically at frequency $F_{cyc}=F_{CLK} \cdot W_0/2^{NA}$. Thus, $F_{ref}=F_{cyc} \cdot P$ and $F=F_{cyc} \cdot Q$: the time-period of the reference signal r(t) is P times shorter than that of the signal produced by the cyclic accumulator 101, and the time-period of the signal to be measured s(t) is Q times shorter than that of the signal produced by the cyclic accumulator 101. This accumulator therefore produces a cycle synchronization signal.

The signal to be measured s(t) is collected from the resonator 200, possibly through an amplifier 120. Examples for a resonator 200 will be given below, at the end of this description. The signal to be measured s(t) is then processed by the acquisition channel 2, then by the computation unit 3, denoted CALC. This unit produces numerical values as results for the amplitude A and the phase delay $\Phi$ of the signal to be measured s(t).

The acquisition channel 2 comprises a comparator 130, denoted COMP., and a latch register 140, denoted REG. The comparator 130 receives the reference signal r(t) and the signal to be measured s(t) at two separate inputs. It outputs a comparison signal which has transitions whenever the reference signal r(t) becomes greater than the signal to be measured s(t). Although the remainder of the present description is in accordance with this operation of the comparator 130, an equivalent operation can be achieved with a comparator which produces transitions in the comparison signal whenever the signal to be measured s(t) becomes greater than the reference signal r(t). The comparison signal is then transmitted to the latch register 140 which simultaneously receives, on a separate input, the instantaneous value of the phase $\psi(t)$ of the reference signal r(t), from the cyclic accumulator 103. The latch register 140 then successively outputs the values of the phase $\psi(t)$ at the times when the reference signal r(t) has become greater than the signal to be measured s(t). These values, denoted $\psi_k$ and numbered with the integer k starting at 1, are then transmitted to the computation unit 3.

The computation unit 3 is advantageously implemented as a dedicated circuit, or ASIC, or a programmable logic device, or FPGA. Possibly, the functions of the comparator 130 and latch register 140 can also be executed by this ASIC or this FPGA.

Figure 2:
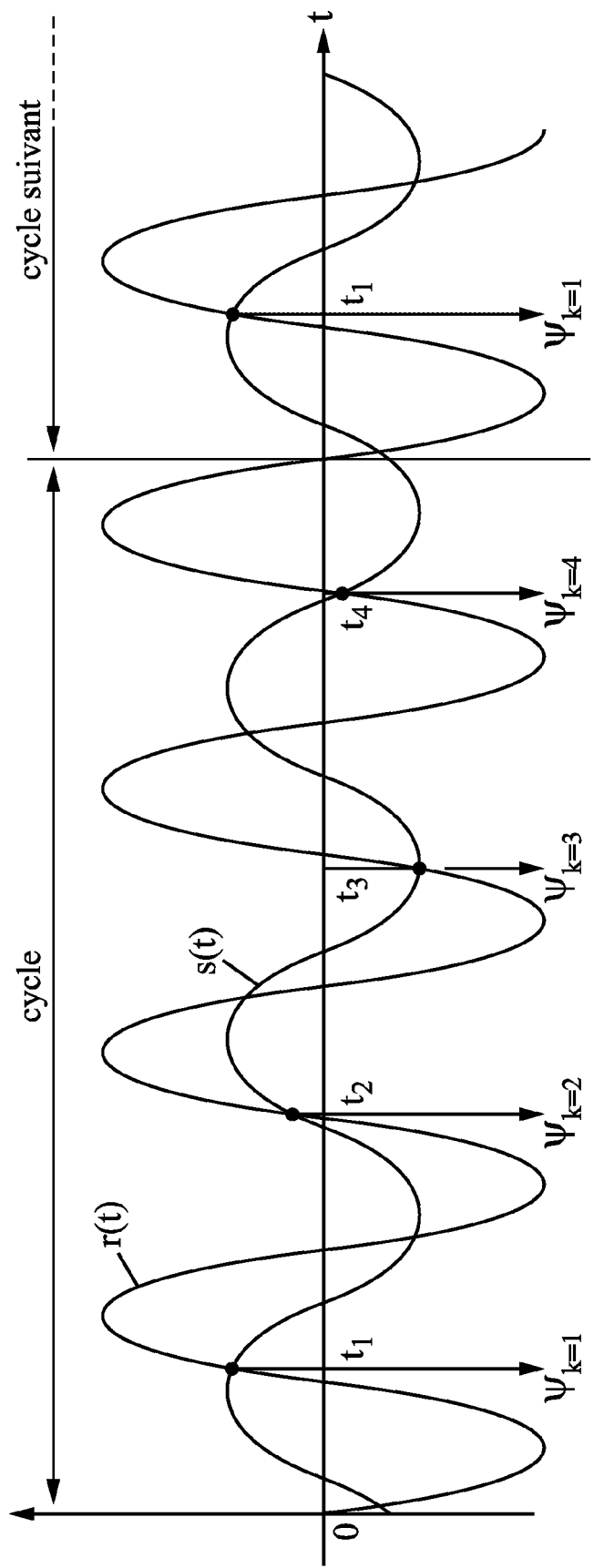
FIG. 2 is a time-diagram showing phase values selected by a system according to the invention.

FIG. 2 is a time-diagram of the signals r(t) and s(t). It shows the times $t_1, t_2, t_3, \ldots, t_k, \ldots$ at which the reference signal r(t) becomes greater than the signal to be measured s(t). The corresponding values of the phase $\psi(t)$ of the reference signal r(t) are respectively $\psi_{k=1}=\psi(t_1)$ denoted $\psi_1$ below, $\psi_{k=2}=\psi(t_2)$ denoted $\psi_2$, $\psi_{k=3}=\psi(t_3)$ denoted $\psi_3$, ..., $\psi_k=\psi(t_k)$, .... The index k thus counts the successive periods of the reference signal r(t) starting at the initial time t=0. The two series of amplitude values and phase values $\psi_k$ at the intersection points between the curves of the signals r(t) and s(t) are periodic, with the period duration equal to $1/F_{cyc}$. This period duration defines an acquisition cycle for phase values $\psi_k$ which is suitable for implementing the invention. Successive acquisition cycles can then be governed by the signal generated by the cyclic accumulator 101, introduced above, and the index k ranges from 1 to P during each acquisition cycle, of individual duration $1/F_{cyc}$.

In general for the invention, the integer P may be equal to the integer Q plus one: P=Q+1. For example, Q may be equal to 3 and P may be equal to 4. FIG. 3 corresponds to these values of P and Q, and shows a complete acquisition cycle with the start of the next cycle.

The equations satisfied by the times $t_k$ are $s(t_k)=r(t_k)$, which is:

$$A \cdot \sin[2\pi \cdot (Q/P) \cdot F_{ref} \cdot t_k - \Phi] = -A_{ref} \cdot \sin(2\pi \cdot F_{ref} \cdot t_k) \quad (3)$$

According to the operation of the acquisition channel 2:

$$2\pi \cdot F_{ref} \cdot t_k = \psi_k + 2 \cdot k\pi - \pi \quad (4)$$

The equations (3) then become, for each value of k:

$$A \cdot \sin[(Q/P) \cdot (\psi_k + (2k-1)\pi) - \Phi] = A_{ref} \sin(\psi_k) \quad (5)$$

By using the notation $a = A/A_{ref}$ and $\alpha_{k0} = (Q/P) \cdot (2k-1)\pi$, the equations which are satisfied by the phase values $\psi_k$ are, as reproduced in FIG. 3a:

$$a \cdot \sin[\alpha_{k0} + (Q/P) \cdot \psi_k - \Phi] = \sin(\psi_k) \quad (6)$$

The value $A_{ref}$ of the amplitude of the reference signal r(t) is stored for later use by the computation unit 3. By expanding the sine of the first term, we obtain:

$$a \cdot \sin[\alpha_{k0} + (Q/P) \cdot \psi_k] \cdot \cos(\Phi) - a \cdot \cos[\alpha_{k0} + (Q/P) \cdot \psi_k] \cdot \sin(\Phi) = \sin(\psi_k) \quad (7)$$

The following change of variables is then made, which introduces the in-phase amplitude X and the quadrature amplitude Y of the signal to be measured s(t):

$$X = a \cdot \cos(\Phi) \quad (8a)$$

$$Y = a \cdot \sin(\Phi) \quad (8b)$$

For each value of k, the equations (7) then become, as a function of the new unknown quantities X and Y which replace $A_{ref}$ and $\Phi$ in a first phase of the resolution:

$$\sin[\alpha_{k0} + (Q/P) \cdot \psi_k] \cdot X - \cos[\alpha_{k0} + (Q/P) \cdot \psi_k] \cdot Y = \sin(\psi_k) \quad (9)$$

which corresponds to the matrix notation of FIG. 3b.

Solving the system of equations (9) provides the values of the in-phase amplitude X and quadrature amplitude Y of the measured signal s(t). From these values for X and Y, equations (8a) and (8b) give the values of a and of the phase delay $\Phi$, for example by $(X^2+Y^2)^{1/2}$ and $\Phi = \text{Arctan}(Y/X)$, then the amplitude A of the signal to be measured s(t) is calculated as the product $a \cdot A_{ref}$. As a result, the rest of this description is focused on solving the system of equations (9), corresponding to FIG. 3b, by proposing several alternative methods for this purpose which can be implemented by the computation unit 3: exact resolution method, approximate resolution method, and method by decomposition into Fourier series of the phase values $\psi_k$.

Exact Resolution:

The system of equations (9) corresponding to the matrix notation of FIG. 3b, with the two amplitudes X and Y as unknown quantities, is a system of affine equations whose coefficients depend on the phase values $\psi_k$ that have been supplied by the acquisition channel 2. These coefficients, $\sin[\alpha_{k0} + (Q/P) \cdot \psi_k]$ and $-\cos[\alpha_{k0} + (Q/P) \cdot \psi_k]$ for each value of k corresponding to a separate equation, are then calculated by the computation unit 3, then the system can be solved exactly by one of the methods known to the skilled person: matrix inversion of the system formed by two of the equations (9), or least-square resolution method, etc. When the matrix inversion method is used, the 2×2 matrix of the coefficients of X and Y in the two equations (9) that are used is calculated, and then inverted, and the inverse matrix is applied to the second terms $\sin(\psi_k)$ of the two equations (9) used, for obtaining the values of X and Y. The least-square resolution method is more accurate, however, because it uses all the equations (9).

As the coefficients $\sin[\alpha_{k0} + (Q/P) \cdot \psi_k]$ and $-\cos[\alpha_{k0} + (Q/P) \cdot \psi_k]$ are variable according to the phase values $\psi_k$ supplied by the acquisition channel 2, the calculations of the sine and cosine values which constitute the coefficients of X and Y in the equations (9) may consume time and computing resources. It is possible to replace the sine and cosine functions by their finite expansions, preferably at least up to order five in order to limit the resulting errors in the values of X and Y.

Approximate Resolution for Small Values of a:

This method can be applied when the amplitude $A_{ref}$ of the reference signal r(t) is or can be adjusted to be much greater than the amplitude A of the signal to be measured s(t). In other words: a<<1, and from equation (6), the phase values $\psi_k$ are much lower than $\pi$ and therefore also much lower than the values of $\alpha_{k0}$. Under these conditions, the equations (6) become:

$$a \cdot \sin(\alpha_{k0} - \Phi) \approx \psi_k \quad (10)$$

in other words as a function of the unknown quantities X and Y:

$$X \cdot \sin(\alpha_{k0}) - Y \cdot \cos(\alpha_{k0}) \approx \psi_k \quad (11)$$

which corresponds to the matrix notation of FIG. 3c.

This time, the respective coefficients $\sin(\alpha_{k0})$ and $-\cos(\alpha_{k0})$ of X and Y in the affine equations (11) are constant. They can therefore be pre-calculated. The 2×2 matrix of the system formed by any two of the equations (11) can then also be inverted beforehand, and the inverse matrix can be saved in order to be directly available to the computation unit 3. The values of the amplitudes X and Y can then be simply calculated by applying this inverse matrix to the second terms $\psi_k$ of the two equations (11) used. Such saving of the inverse matrix beforehand may also be used for the least-square resolution method.

Fourier Series Decomposition Method

As already seen, the series of phase values $\psi_k$ is periodic, with $1/F_{cyc}$ as the time-period. The successive values of $\alpha_{k0}$ as well. One therefore seeks to solve the system of equations (9) by expressing the phase values $\psi_k$ as a linear combination of $\sin(\alpha_{k0})$, $\cos(\alpha_{k0})$, $\sin(2 \cdot \alpha_{k0})$, $\cos(2 \cdot \alpha_{k0})$, $\sin(3 \cdot \alpha_{k0})$, $\cos(3 \cdot \alpha_{k0})$, ... meaning:

$$\psi_k = \Sigma_{i=1,2,3,\ldots,P}[H_{ip} \cdot \cos(i \cdot \alpha_{k0}) + H_{iq} \cdot \sin(i \cdot \alpha_{k0})] \quad (12)$$

which corresponds to the notation expanded in FIG. 4a. This notation is the decomposition of the phase values $\psi_k$ into Fourier series, on the basis of the $\alpha_{k0}$ values. $H_{1p}$ is thus the amplitude of the fundamental in-phase component of the $\psi_k$ values, $H_{1q}$ is the amplitude of the fundamental quadrature component of the $\psi_k$ values, and the coefficients $H_{ip}$ and $H_{iq}$ for i greater than 1 are the amplitudes of the harmonic components of order i.

However, equation (9) can be written:

$$[X \cdot \sin(\alpha_{k0}) - Y \cdot \cos(\alpha_{k0})] \cdot \cos((Q/P) \cdot \psi_k) + [X \cdot \cos(\alpha_{k0}) + Y \cdot \sin(\alpha_{k0})] \cdot \sin((Q/P) \cdot \psi_k) - \sin(\psi_k) = 0 \quad (13)$$

By expanding $\cos((Q/P) \cdot \psi_k)$, $\sin((Q/P) \cdot \psi_k)$ and $\sin(\psi_k)$ into Fourier series of $(Q/P) \cdot \psi_k$ and $\psi_k$, and transferring the expression (12) for $\psi_k$, then converting all terms of the form $\sin^n(i \cdot \alpha_{k0})$ and $\cos^n(i \cdot \alpha_{k0})$ into linear combinations of terms of the form $\sin(n'i \cdot \alpha_{k0})$ and $\cos(n'i \cdot \alpha_{k0})$, one obtains a zero linear combination of the terms $\sin(n \cdot i \cdot \alpha_{k0})$ and $\cos(n \cdot i \cdot \alpha_{k0})$. Each of the factors of this linear combination must therefore be zero, which leads to a system of affine equations whose unknown quantities are the coefficients $H_{ip}$ and $H_{iq}$, i describing the set of non-zero natural integers less than or equal to P. The first coefficients of the decomposition of $\psi_k$ into Fourier series which are thus obtained are:

$$H_{1p} = X + [(P^2 - Q^2)/(8P^2)] \cdot X^3 + [(P^2 - Q^2)/(8P^2)] \cdot X \cdot Y^2 + \text{term in } X^4 + \ldots \quad (14a)$$

$$H_{2p} = (Q/2P) \cdot X^2 + \text{term in } X^4 + \ldots \quad (14b)$$

$$H_{3p} = [(P^2 - 9Q^2)/(24P^2)] \cdot X^3 + [(P^2 - 9Q^2)/(8P^2)] \cdot X \cdot Y^2 + \text{term in } X^4 + \ldots \quad (14c)$$

$$H_{4p} = [(P^2Q - 4Q^3)/(2P^3)] \cdot X^2 \cdot Y^2 + \text{term in } X^4 + \ldots \quad (14d)$$

$$H_{5p} = -[(9P^4 - 250P^2Q^2 + 625Q^4) \cdot Y^2/(192P^4)] \cdot X^3 + \text{term in } X^5 \quad (14e)$$

...

$$H_{1q} = Y + [(P^2 - Q^2)/(8P^2)] \cdot X^2 \cdot Y + \text{term in } Y^3 + \quad (14f)$$

$$H_{2q} = (Q \cdot X/P) \cdot Y + \text{term in } Y^3 + \ldots \quad (14g)$$

$$H_{3q} = [(-P^2 + 9Q^2)/(8P^2)] \cdot X^2 \cdot Y + \text{term in } Y^3 + \ldots \quad (14h)$$

...

Moreover, the coefficients $H_{ip}$ and $H_{iq}$ of the Fourier series decomposition can be calculated in the usual manner from the phase values $\psi_k$ supplied by the acquisition channel 2. However, it is possible to calculate approximate values of the coefficients $H_{1p}$ and $H_{1q}$ more quickly, denoted $H'_{1p}$ and $H'_{1q}$, by applying the first matrix relation of FIG. 4b to the phase values $\psi_k$ (example given with P equal to 12). The values thus calculated $H'_{1p}$ and $H'_{1p}$ are then used directly as values for $H_{1p}$ and $H_{1p}$. To calculate the coefficients of the harmonic amplitudes of order 3 and 5 under the same conditions of simplicity, the integer P must also be a multiple of 3 and 5, in addition to being a multiple of 4 for the simplified calculations of $H_{1p}$, $H_{1p}$, and $H_{2p}$, $H_{2q}$, and also $H_{4p}$, $H_{4q}$. To implement such computational simplifications, P is therefore preferably a multiple of 60. When the integer P is again equal to 12, the second matrix relation of FIG. 4b shows the calculation of the approximate values of the coefficients $H_{3p}$ and $H_{3q}$, denoted $H'_{3p}$ and $H'_{3q}$.

By identifying the first coefficients $H_{ip}$ and $H_{iq}$ of the Fourier decomposition of the phase values $\psi_k$, calculated from these latter as supplied by the acquisition channel 2, with the expressions of equations (14a-14h), the amplitudes X and Y can be obtained in an approximate manner by combining several of the equations (14a-14h) as follows:

$$X \approx H_{1p} + 3 \cdot H_{3p} \cdot (P^2 - Q^2)/(P^2 - 9 \cdot Q^2) + H_{5p} \cdot (P^2 - Q^2)/(P^2 - 25 \cdot Q^2) \quad (15a)$$

$$Y \approx H_{1q} - H_{3q} \cdot (P^2 - Q^2)/(P^2 - 9 \cdot Q^2) \quad (15b)$$

Thus, an approximate value of X can be calculated simply by linearly combining, with combination factors which are fixed and predetermined, the values of the three amplitudes of Fourier components $H_{1p}$, $H_{3p}$ and $H_{5p}$ only. In parallel, an approximate value of Y can be calculated simply by linearly combining the values of the two amplitudes of Fourier components $H_{1p}$ and $H_{3q}$ only. For the combinations of equations (15a-15b), the first neglected terms are in $X \cdot Y^2$. Other combinations may alternatively be used to calculate approximate values of the amplitudes X and Y, neglecting terms in $X^3$ instead of those in $X \cdot Y^2$.

Note that it is possible to maximize the value of the in-phase amplitude X of the signal to be measured s(t) relative to the quadrature amplitude Y by initially applying a rotation between the P phase values $\psi_k$. Such a rotation amounts to shifting the initial time t=0 in order to reduce the phase delay $\Phi$. This minimizes the residual cross terms in $X \cdot Y^2$ in $H_{ip}$.

Figure 5:
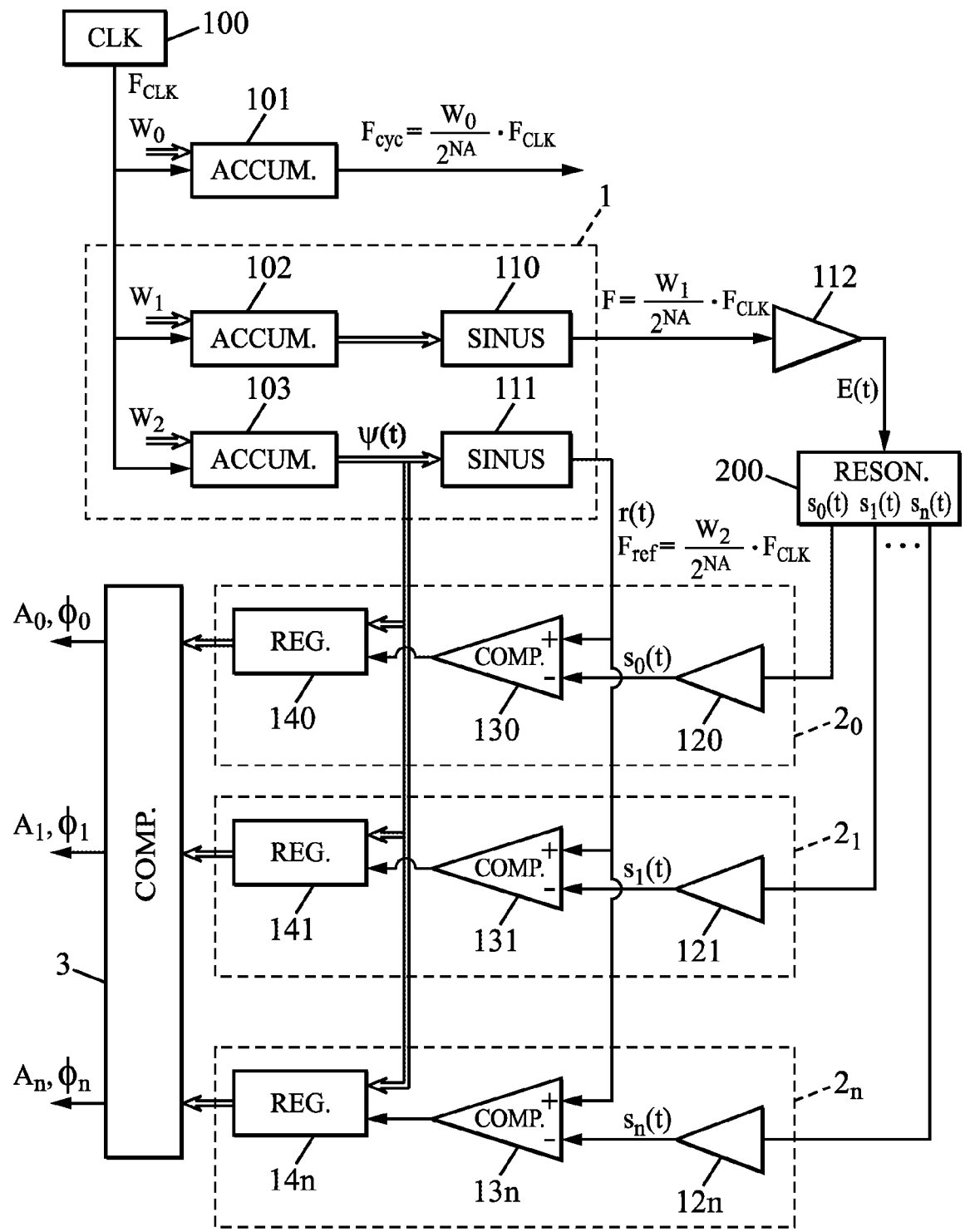
FIG. 5 corresponds to FIG. 1 for an improvement of the invention which is suitable for multiple signals to be measured simultaneously.

FIG. 5 corresponds to FIG. 1 when the resonator 200, or equivalently a set of resonators referenced 200, simultaneously produces multiple responses to the single excitation signal E(t). Such is the case, for example, when the resonator or set of resonators 200 is part of a vibrating accelerometer or a vibrating gyroscope. Each signal to be measured, denoted $s_0(t)$, $s_1(t)$, ..., $s_n(t)$, constitutes a separate response to the excitation signal E(t), and a separate acquisition channel is dedicated to each of these signals to be measured. Thus, acquisition channel $2_0$ comprising comparator 130 and latch register 140, and also possibly amplifier 120, is dedicated to signal to be measured $s_0(t)$. Similarly, acquisition channel $2_1$ comprising comparator 131 and latch register 141, and also possibly amplifier 121, is dedicated to signal to be measured $s_1(t)$, ..., acquisition channel $2_n$ comprising comparator 13n and latch register 14n, and also possibly amplifier 12n, is dedicated to signal to be measured $s_n(t)$. The comparators 130, 131, ..., 13n receive in parallel the reference signal r(t) from the signal shaping-unit 111, and the latch registers 140, 141, ..., 14n receive in parallel the phase $\psi(t)$ of the reference signal r(t) from the cyclic accumulator 103. The synthesis unit 1 is thus shared by all acquisition channels $2_0$, $2_1$, ..., $2_n$. The computation unit 3 may also be shared by all acquisition channels $2_0$, $2_1$, ..., $2_n$, for example by operating in alternation, in successive acquisition periods, from the phase values supplied by one or another of the acquisition channels. The unit 3 thus determines the amplitude and phase delay values of all signals to be measured: $A_0$ and $\Phi_0$ for signal to be measured $s_0(t)$, $A_1$ and $\Phi_1$ for signal to be measured $s_1(t)$, ..., $A_n$ and $\Phi_n$ for signal to be measured $s_n(t)$.

When the set of resonators 200 is an accelerometer, it may be composed of at least three beams which are each tensioned by a inertial mass, and are oriented differently from the other beams, for example in three perpendicular directions. Each beam can be made to oscillate transversely by the excitation signal E(t), and the signals to be measured $s_1(t)$, $s_2(t)$ and $s_3(t)$ may characterize the instantaneous displacements by transverse vibrations for the three beams, respectively. Then, the skilled person knows how to determine the three components of a driving acceleration from the values of the amplitudes and phase delays $A_1$ and $\Phi_1$, $A_2$ and $\Phi_2$, and $A_3$ and $\Phi_3$ respectively, of the signals to be measured $s_1(t)$, $s_2(t)$ and $s_3(t)$.

When the resonator 200 is a gyroscope, it may consist of a vibrating structure having at least four eigenmodes that can be coupled by a Coriolis force field. The signals to be measured $s_1(t)$, $s_2(t)$ and $s_3(t)$ can then characterize the couplings between one excitation eigenmode and three distinct eigenmodes that are coupled to the excitation eigenmode by the Coriolis force field. The excitation signal E(t) is applied to the excitation eigenmode, and the signals of instantaneous displacements related to the three other vibration eigenmodes constitute the three signals to be measured $s_1(t)$, $s_2(t)$ and $s_3(t)$. Then, the skilled person knows how to determine the three components of a driving rotation from the values of the amplitudes and phase delays $A_1$ and $\Phi_1$, $A_2$ and $\Phi_2$, and $A_3$ and $\Phi_3$ respectively of the three signals to be measured $s_1(t)$, $s_2(t)$ and $s_3(t)$.

The driving acceleration or the driving rotation that is thus measured may result in particular from the movement of a device or vehicle carrying the accelerometer or gyroscope, such as an aircraft, a satellite, a spacecraft, etc.

The invention claimed is:

1. A system for providing an amplitude value (A) and a phase delay value ($\Phi$) which relate to a signal to be measured (s(t)) having sinusoidal variations over time (t) with a frequency F, said system comprising:
   a synthesis unit (1), adapted to generate a reference signal (r(t)) having a sinusoidal form of time-variations, in continual phase coherence with the signal to be measured (s(t)), said reference signal having an amplitude ($A_{ref}$) larger than the amplitude (A) of the signal to be measured (s(t)) and having a frequency equal to $F_{ref} = F \times P/Q$, where P and Q are two fixed, non-zero positive integers, P being greater than Q;
   a comparator (130) connected to receive the signal to be measured (s(t)) and the reference signal (r(t)) on two inputs of said comparator, and adapted to output a signal transition each time the signal to be measured becomes less than the reference signal, or each time the signal to be measured becomes greater than the reference signal;

a latch register (140) connected to receive instantaneous values on a data input of said register, and to receive a signal that is outputted by the comparator (130) on an enabling input of said register, and adapted to select those of the instantaneous values ($\psi_k$) that are received by said register at the same time as a transition of the signal produced by the comparator, the comparator and the register thus forming an acquisition channel (2) for the signal to be measured (s(t)); and a computation unit (3) connected to receive the selected values, and adapted to calculate values of the amplitude (A) and phase delay ($\Phi$) of the signal to be measured (s(t)) from said selected values, wherein the latch register (140) is connected for receiving instantaneous values of a phase ($\psi(t)$) of the reference signal (r(t)) on the data input of said register, wherein the computation unit (3) is connected for receiving the selected values ($\psi_k$) of the phase ($\psi(t)$) of the reference signal (r(t)), and is adapted for calculating the values of the amplitude (A) and phase delay ($\Phi$) of the signal to be measured (s(t)) from said values selected for the phase of the reference signal, and wherein the computation unit (3) is adapted to calculate
an in-phase amplitude value (X) of the signal to be measured (s(t)), equal to a·cos$\Phi$ where $\Phi$ is the value of the phase delay of the signal to be measured and a is a quotient of the amplitude (A) of the signal to be measured (s(t)) divided by the amplitude ($A_{ref}$) of the reference signal (r(t)), and a quadrature amplitude value (Y) of the signal to be measured, equal to a·sin$\Phi$, from a system of affine equations having coefficients, for the in-phase amplitude (X) and the quadrature amplitude (Y) of the signal to be measured (s(t)), which depend on the selected values ($\psi_k$) for the phase of the reference signal (r(t)).

2. The system according to claim 1, wherein the integer P is equal to the integer Q plus one.

3. The system according to claim 2, wherein at least one among the synthesis unit (1), the latch register (140), and the computation unit (3) is formed by a programmable logic circuit (FPGA) or a dedicated circuit (ASIC).

4. The system according to claim 2, wherein the computation unit (3) is adapted to calculate the coefficients of the system of affine equations from the selected values ($\psi_k$) for the phase of the reference signal (r(t)), and to calculate the values of the in-phase amplitude (X) and quadrature amplitude (Y) of the signal to be measured (s(t)) by applying an algorithm for solving said system of affine equations, for example an affine equation inversion algorithm or a least-square resolution algorithm.

5. The system according to claim 2, wherein the computation unit (3) is adapted to determine approximate values for the coefficients of the in-phase amplitude (X) and quadrature amplitude (Y) of the signal to be measured s(t) in the system of affine equations, said approximate values of the coefficients being independent of the selected values ($\psi_k$) for the phase of the reference signal (r(t)), and said selected values for the phase of the reference signal constituting affine terms of said system of affine equations, and the computation unit is further adapted to calculate approximate values of the in-phase amplitude (X) and quadrature amplitude (Y) of the signal to be measured (s(t)), as linear combinations of the selected values for the phase of the reference signal.

6. The system according to claim 2, wherein the computation unit (3) is adapted to calculate amplitudes of fundamental in-phase ($H_{1p}$) and quadrature components ($H_{1q}$) and of harmonic components ($H_{2p}$, $H_{2q}$, ... ) for the selected values ($\psi_k$) for the phase of the reference signal (r(t)), and the computation unit is further adapted to calculate approximate values of the in-phase amplitude (X) and quadrature amplitude (Y) of the signal to be measured (s(t)), from linear combinations of said amplitudes of the fundamental in-phase and quadrature components and the harmonic components of the selected values for the phase of the reference signal.

7. The system according to claim 1, wherein at least one among the synthesis unit (1), the latch register (140), and the computation unit (3) is formed by a programmable logic circuit (FPGA) or a dedicated circuit (ASIC).

8. The system according to claim 7, wherein the computation unit (3) is adapted to calculate the coefficients of the system of affine equations from the selected values ($\psi_k$) for the phase of the reference signal (r(t)), and to calculate the values of the in-phase amplitude (X) and quadrature amplitude (Y) of the signal to be measured (s(t)) by applying an algorithm for solving said system of affine equations, for example an affine equation inversion algorithm or a least-square resolution algorithm.

9. The system according to claim 7, wherein the computation unit (3) is adapted to determine approximate values for the coefficients of the in-phase amplitude (X) and quadrature amplitude (Y) of the signal to be measured s(t) in the system of affine equations, said approximate values of the coefficients being independent of the selected values ($\psi_k$) for the phase of the reference signal (r(t)), and said selected values for the phase of the reference signal constituting affine terms of said system of affine equations, and the computation unit is further adapted to calculate approximate values of the in-phase amplitude (X) and quadrature amplitude (Y) of the signal to be measured (s(t)), as linear combinations of the selected values for the phase of the reference signal.

10. The system according to claim 1, wherein the computation unit (3) is adapted to calculate the coefficients of the system of affine equations from the selected values ($\psi_k$) for the phase of the reference signal (r(t)), and to calculate the values of the in-phase amplitude (X) and quadrature amplitude (Y) of the signal to be measured (s(t)) by applying an algorithm for solving said system of affine equations, for example an affine equation inversion algorithm or a least-square resolution algorithm.

11. The system System according to claim 1, wherein the computation unit (3) is adapted to determine approximate values for the coefficients of the in-phase amplitude (X) and quadrature amplitude (Y) of the signal to be measured s(t) in the system of affine equations, said approximate values of the coefficients being independent of the selected values ($\psi_k$) for the phase of the reference signal (r(t)), and said selected values for the phase of the reference signal constituting affine terms of said system of affine equations, and the computation unit is further adapted to calculate approximate values of the in-phase amplitude (X) and quadrature amplitude (Y) of the signal to be measured (s(t)), as linear combinations of the selected values for the phase of the reference signal.

12. The system according to claim 1, wherein the computation unit (3) is adapted to calculate amplitudes of fundamental in-phase ($H_{1p}$) and quadrature components ($H_{1q}$) and of harmonic components ($H_{2p}$, $H_{2q}$, . . . ) for the selected values ($\psi_k$) for the phase of the reference signal (r(t)), and the computation unit is further adapted to calculate approximate values of the in-phase amplitude (X) and quadrature amplitude (Y) of the signal to be measured (s(t)), from linear combinations of said amplitudes of the fundamental in-phase and quadrature components and the harmonic components of the selected values for the phase of the reference signal.

13. The system according to claim 12, wherein the computation unit (3) is adapted to calculate approximate values for the amplitudes of the fundamental in-phase ($H_{1p}$) and quadrature ($H_{1q}$) components and the harmonic components ($H_{2p}$, $H_{2q}$, . . . ) of the selected values ($\psi_k$) for the phase of the reference signal (r(t)), as combinations of additions and subtractions of said selected values for the phase of the reference signal, and the computation unit is further adapted to calculate approximate the values for the in-phase amplitude (X) and quadrature amplitude (Y) of the signal to be measured (s(t)), from linear combinations of the approximate values for the amplitudes of the fundamental in-phase and quadrature components and the harmonic components of the selected values for the phase of the reference signal.

14. The system according to claim 13, wherein P is a multiple of 60.

15. The system according to claim 1, adapted to provide amplitude values (A) and phase delay values (Φ) relating to a plurality of signals to be measured ($s_0(t)$, $s_1(t)$, . . . ) each having sinusoidal variations over time (t), said signals to be measured all having the frequency F,
said system comprising respective acquisition channels ($2_0$, $2_1$, . . . ) individually dedicated to the signals to be measured ($s_0(t)$, $s_1(t)$, . . . ), each acquisition channel comprising a comparator (130, 131, . . . ) and a latch register (140, 141, . . . ) adapted and connected in accordance with claim 1, separately from the other acquisition channels,
the synthesis unit (1) being common to all the acquisition channels ($2_0$, $2_1$, . . . ), for transmitting the reference signal (r(t)) simultaneously to all the comparators (130, 131, . . . ) and for transmitting the instantaneous values of the phase (ψ(t)) of said reference signal simultaneously to all the latch registers (140, 141, . . . ).

16. The system Systcm according to claim 11, wherein the synthesis unit (1) comprises
an input for receiving a clock signal;
a first cyclic accumulator (102) adapted to generate a phase of an excitation signal (E(t)) from the clock signal in accordance with a first accumulation increment ($W_1$);
a second cyclic accumulator (103) adapted to generate a phase (ψ(t)) of the reference signal (r(t)) from the clock signal in accordance with a second accumulation increment ($W_2$);
a first signal-shaping unit (110) for producing the excitation signal (E(t)) with a sinusoidal form of time-variations, from the phase generated by the first cyclic accumulator (102); and
a second signal-shaping unit (111) for producing the reference signal (r(t)) from the phase (ψ(t)) generated by the second cyclic accumulator (103);
the system being adapted to provide the excitation signal (E(t)) to an external device (200), and to collect the signal to be measured (s(t)) as a response of said external device to the excitation signal,
and wherein the first ($W_1$) and second ($W_2$) accumulation increments are positive integers, such that a quotient of the first accumulation increment ($W_1$) divided by Q is equal to a quotient of the second accumulation increment ($W_2$) divided by P, and is also equal to a positive integer ($W_0$) called cycle increment,
such that the frequency F is equal to a first product of a frequency ($F_{CLK}$) of the clock signal multiplied by the integer Q and by the cycle increment ($W_0$), divided by $2^{NA}$ where NA is the number of bits used in each cyclic accumulator (102, 103),
and the reference frequency $F_{REF}$ is equal to a second product of the frequency ($F_{CLK}$) of the clock signal multiplied by the integer P and by the cycle increment ($W_0$), divided by $2^{NA}$.

17. A method for providing an amplitude value (A) and a phase delay value (Φ) which relate to a signal to be measured (s(t)) having sinusoidal variations over time (t) with a frequency F, said method comprising the following steps:
generating a reference signal (r(t)) having a sinusoidal form of time-variations, in continual phase coherence with the signal to be measured (s(t)), said reference signal having an amplitude ($A_{ref}$) larger than the amplitude (A) of the signal to be measured, and having a frequency equal to $F_{ref}$=F×P/Q, where P and Q are two fixed, non-zero positive integers, P being greater than Q;
selecting instantaneous values for which the signal to be measured (s(t)) becomes smaller than the reference signal, or for which the signal to be measured becomes larger than the reference signal; and
calculating the values of the amplitude (A) and the phase delay (Φ) of the signal to be measured (s(t)) from the selected values,
wherein the instantaneous values which are selected are instantaneous values ($\psi_k$) of a phase (ψ(t)) of the reference signal (r(t)),
wherein the values of the amplitude (A) and phase delay (Φ) of the signal to be measured (s(t)) are calculated from the values selected ($\psi_k$) for the phase of the reference signal (r(t)), and
wherein a computation unit (3) calculates an in-phase amplitude value (X) of the signal to be measured (s(t)), equal to a·cosΦ where Φ is the value of the phase delay of the signal to be measured and a is a quotient of the amplitude (A) of the signal to be measured (s(t)) divided by the amplitude ($A_{ref}$) of the reference signal (r(t)), and a quadrature amplitude value (Y) of the signal to be measured, equal to a·sinΦ, from a system of affine equations having coefficients, for the in-phase amplitude (X) and the quadrature amplitude (Y) of the signal to be measured (s(t)), which depend on the selected values ($\psi_k$) for the phase of the reference signal (r(t)), wherein the method is carried out using a system according to claim 1.

18. A method for providing an amplitude value (A) and a phase delay value (Φ) which relate to a signal to be measured (s(t)) having sinusoidal variations over time (t) with a frequency F, said method comprising the following steps:
generating a reference signal (r(t)) having a sinusoidal form of time-variations, in continual phase coherence with the signal to be measured (s(t)), said reference signal having an amplitude ($A_{ref}$) larger than the amplitude (A) of the signal to be measured, and having a frequency equal to $F_{ref}=F\times P/Q$, where P and Q are two fixed, non-zero positive integers, P being greater than Q;

selecting instantaneous values for which the signal to be measured (s(t)) becomes smaller than the reference signal, or for which the signal to be measured becomes larger than the reference signal; and calculating the values of the amplitude (A) and the phase delay (Φ) of the signal to be measured (s(t)) from the selected values, wherein the instantaneous values which are selected are instantaneous values ($\psi_k$) of a phase ($\psi(t)$) of the reference signal (r(t)), wherein the values of the amplitude (A) and phase delay (Φ) of the signal to be measured (s(t)) are calculated from the values selected ($\psi_k$) for the phase of the reference signal (r(t)), and wherein a computation unit (3) calculates an in-phase amplitude value (X) of the signal to be measured (s(t)), equal to $a \cdot \cos\Phi$ where Φ is the value of the phase delay of the signal to be measured and a is a quotient of the amplitude (A) of the signal to be measured (s(t)) divided by the amplitude ($A_{ref}$) of the reference signal (r(t)), and a quadrature amplitude value (Y) of the signal to be measured, equal to $a \cdot \sin\Phi$, from a system of affine equations having coefficients, for the in-phase amplitude (X) and the quadrature amplitude (Y) of the signal to be measured (s(t)), which depend on the selected values ($\psi_k$) for the phase of the reference signal (r(t)).

19. The method according to claim 18, used for characterizing a response of a resonator vibrated by an excitation signal (E(t)) having a sinusoidal form of time-variations with frequency F, the signal to be measured (s(t)) being the response of said resonator to the excitation signal.

20. The method according to claim 19, wherein the resonator is part of a vibrating accelerometer or a vibrating gyroscope, and the values of the amplitude (A) and phase delay (Φ) relating to the signal to be measured (s(t)) are then used to calculate acceleration or rotational speed values of a device or a vehicle carrying the accelerometer or gyroscope.

* * * * *